United States Patent
Sonokawa

(10) Patent No.: US 6,686,127 B2
(45) Date of Patent: Feb. 3, 2004

(54) PLATE-MAKING METHOD FOR PRODUCING WATERLESS LITHOGRAPHIC PRINTING PLATE

(75) Inventor: Koji Sonokawa, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 46 days.

(21) Appl. No.: 09/983,900

(22) Filed: Oct. 26, 2001

(65) Prior Publication Data

US 2002/0081529 A1 Jun. 27, 2002

(30) Foreign Application Priority Data

Oct. 27, 2000 (JP) ........................................ 2000-328207

(51) Int. Cl.$^7$ .................................................. G03F 7/11
(52) U.S. Cl. ................ 430/303; 430/272.1; 430/273.1; 430/434; 430/494; 430/944; 430/945; 101/463.1; 101/467
(58) Field of Search ......................... 430/270.1, 271.1, 430/272.1, 273.1, 281.1, 284.1, 286.1, 302, 303, 348, 401, 434, 494, 944, 945, 964; 101/130, 453, 463.1, 465, 466, 467

(56) References Cited

U.S. PATENT DOCUMENTS

| | | | | |
|---|---|---|---|---|
| 5,888,696 A | * | 3/1999 | Hirano et al. | 430/272.1 |
| 5,919,600 A | * | 7/1999 | Huang et al. | 430/272.1 |
| 6,085,655 A | * | 7/2000 | Harris et al. | 101/456 |
| 6,132,933 A | * | 10/2000 | Nguyen | 430/272.1 |
| 6,284,433 B1 | * | 9/2001 | Ichikawa et al. | 430/303 |
| 6,447,884 B1 | * | 9/2002 | Burberry et al. | 428/195 |
| 2001/0026902 A1 | * | 10/2001 | Hirano et al. | 430/272.1 |

FOREIGN PATENT DOCUMENTS

| | | | |
|---|---|---|---|
| EP | 0 794 055 A2 | 9/1997 | |
| EP | 0 938 028 A1 | 8/1999 | |
| EP | 1 112 843 A2 | 7/2001 | |
| WO | WO 99/11467 | * 3/1999 | B41N/1/00 |

* cited by examiner

Primary Examiner—Janet Baxter
Assistant Examiner—Barbara Gilliam
(74) Attorney, Agent, or Firm—Burns, Doane, Swecker & Mathis, LLP

(57) ABSTRACT

Provided is a plate-making method for producing a waterless lithographic printing plate, wherein the method comprises: (I) an exposing step of imagewise exposure of the precursor with a laser with a controlled condition that a portion of a laser-exposed area in a photo-thermal conversion layer in the precursor remains in the photo-thermal conversion layer of the finished printing plate, and (II) a developing step of removing a silicone rubber layer in the laser-exposed area to form an image on the printing plate. The precursor to be processed comprises (A) a support, (B) an undercoat layer formed by applying onto the support a coating liquid that contains a water-soluble or water-dispersible polymer and water as a solvent, and then drying the coating liquid, (C) a photo-thermal conversion layer which comprises polyurethane and a photo-thermal converting agent; and (D) a silicone rubber layer, laminated in that order.

20 Claims, No Drawings

PLATE-MAKING METHOD FOR PRODUCING WATERLESS LITHOGRAPHIC PRINTING PLATE

BACKGROUND OF THE INVENTION

1. Field of the Invention

The present invention relates to a plate-making method for producing a waterless lithographic printing plate by processing a high-sensitivity lithographic printing plate precursor capable of being processed to form an image thereon through heat-mode recording with laser rays. The waterless lithographic printing plate means that it does not require dampening water for use in printing systems for producing prints.

2. Description of the Related Art

In conventional printing systems that require dampening water, the delicate balance of dampening water and ink is difficult to control, ink is often emulsified, and dampening water is often polluted with ink. Therefore, the systems involve some serious problems in that the ink concentration fluctuates, the background area in the printed matters is stained, and paper loss increases. Contrary to such systems, waterless printing systems in which the lithographic printing plates used do not require dampening water have many advantages.

On the other hand, the recent progress in pre-press systems and other output systems such as image setters and laser printers is remarkable. With that, novel plate-making methods for producing printing plates have been proposed. In these, the images to be printed are converted into digital data, and formed on printing plates in a mode of computer-to-plate or computer-to-cylinder plate-making technique. For such printing systems, printing materials of a novel type are desired and are being developed.

Some laser writing systems for forming waterless lithographic printing plates have been proposed, for example, as in JP-B 21879/1967; JP-A 158405/1975, 94008/1993, 55723/1994, 186750/1994, 314934/1995; U.S. Pat. No. 5,353,705; WO-9401280; and JP-A 91257/1999. These describe the possibility of waterless printing. Concretely, in these, a printing plate precursor is fabricated by forming an ink-repellent silicone rubber layer on a layer that contains a laser ray-absorbing agent such as carbon black and a binder or a thin metal layer, or that is, on such a layer having the ability to convert light into heat (hereinafter referred to as a photo-thermal conversion layer), and this is exposed to laser rays to thereby remove the silicone rubber layer in the exposed area to form an ink-receiving region (image region), while the non-exposed, silicone rubber-remaining region forms an ink-repellent region (non-image region). The thus-completed printing plate enables waterless printing.

Of those, the waterless lithographic printing plate precursor, for which a coating liquid prepared by dissolving or dispersing a photo-thermal converting agent such as carbon black in other components is used for forming the photo-thermal conversion layer, is inexpensive. In this, in addition, since the photo-thermal conversion layer in the laser-exposed area is ablated for image formation, the vapor generated through exposure to laser pushes up the silicone rubber layer in the laser-exposed area to facilitate the removal of the silicone rubber layer in the laser-exposed area in the subsequent step of development (that is, the developability of the precursor is good). This is another advantage of the waterless lithographic printing plate precursor of that type.

The waterless lithographic printing plate precursor of this type requires good adhesiveness between the silicone rubber layer and the photo-thermal conversion layer and between the photo-thermal conversion layer and the support in order that they are well handled in the process of producing the precursor, that they are durable to laser exposure and development in the process of processing into a printing plate, and that the resulting printing plate has good printing durability. The adhesiveness between them is greatly influenced especially by the composition of the photo-thermal conversion layer. In general, when a polyurethane is added to the photo-thermal conversion layer, the adhesiveness of the layer to the silicone rubber layer is improved. In this case, however, if a plastic film of, for example, polyethylene terephthalate is used for the support, the adhesiveness of the support to the photo-thermal conversion layer is often poor; and if so, the photo-thermal conversion layer will peel from the support. This is one problem with this case.

In general, providing an undercoat layer between the support and the photo-thermal conversion layer is effective for solving the problem of poor adhesiveness between them. For the undercoat layer for that purpose, for example, a photosensitive polymer layer is formed on a support and cured thereon by exposing it to light, before the photosensitive layer is formed on the support, as in JP-A 22903/1985; an epoxy resin is thermo-set as in JP-A 50760/1987; or gelatin is cured as in JP-A 133153/1988.

However, the adhesiveness between the polyurethane-containing photo-thermal conversion layer and the support could not be improved sufficiently, depending on the composition of the undercoat layer.

Through our previous studies, we, the present inventors have already found that, when a coating liquid that contains at least a water-soluble or water-dispersible polymer in a solvent of water is coated and dried (this is hereinafter referred to as aqueous coating) on a support to form an undercoat layer thereon, then the adhesiveness between the polyurethane-containing photo-thermal conversion layer and the support is improved. However, in the waterless lithographic printing plate precursor which has the undercoat layer formed in such an aqueous coating method and of which the photo-thermal conversion layer in the laser-exposed area is ablated for image formation, there occurs a problem in that the ink adhesion to the laser-exposed image area of the printing plate is not good and the image density of the printed matters could not increase.

For the waterless lithographic printing plate precursor which is processed for image formation thereon through ablation of the laser-exposed photo-thermal conversion layer, no one knows an effective method of ensuring good adhesiveness between the support and the photo-thermal conversion layer and ensuring good ink adhesion to the image area of the printing plate.

SUMMARY OF THE INVENTION

The object of the present invention is to provide a plate-making method for producing a waterless lithographic printing plate having the advantage of good ink adhesion thereto, which is applicable to a precursor of the printing plate having an undercoat layer formed by aqueous coating with a water-soluble or water-dispersible polymer and having a polyurethane-containing photo-thermal conversion layer formed on the undercoat layer, and therefore having improved interlayer adhesiveness of the constitutive layers.

Through our studies, we, the present inventors have found that the failure in ink adhesion to the image area of a waterless lithographic printing plate is caused by the existence of the undercoat layer formed by aqueous coating with a water-soluble or water-dispersible polymer and exposed out in the image area though exposure to laser rays to remove the overlying silicone rubber layer. Based on this finding, we have further studied how to prevent the undercoat layer from being exposed out in the image area of the printing plate, and have at last found that it can be attained by a specific constitution described below. On the basis of this finding, we have completed the present invention.

Specifically, the plate-making method for producing a waterless lithographic printing plate of the invention comprises (I) an exposing step of imagewise exposure of the precursor with a laser with a such condition that a portion of a laser-exposed area in a photo-thermal conversion layer in the precursor remains in the photo-thermal conversion layer of the finished printing plate; and (II) a developing step of removing a silicone rubber layer in the laser-exposed area to form an image on the printing plate.

DETAILED DESCRIPTION OF THE PREFERRED EMBODIMENTS

The invention is described in detail hereinunder.

First described is the constitution of the waterless lithographic printing plate precursor to which the plate-making method of the invention is applied. The waterless lithographic printing plate precursor to be processed in the invention has, on (A) a support, (B) an undercoat layer formed by applying onto the support a coating liquid that contains a water-soluble or water-dispersible polymer and water as a solvent, followed by drying thereof, (C) a photo-thermal conversion layer which comprises polyurethane and a photo-thermal converting agent, and (D) a silicone rubber layer laminated on the support in that order. The lamination of the layers in that order means that the layers are laminated on the support in the indicated order as above, not excluding the presence of any other layers such as an overcoat layer, interlayer, and back coat layer in the precursor.

(A) Support:

The support for use in the invention must be flexible so that the printing plate comprising it can be well set in ordinary printers, and must be durable to the printing load applied thereto. Typical examples of the support are coated paper; metal sheets of, for example, aluminum or aluminum-containing alloys; plastic films of, for example, polyesters such as polyethylene terephthalate or polyethylene-2,6-naphthalate, as well as polyethylene, polypropylene, polystyrene, polyvinyl chloride, polyvinylidene chloride, polyvinyl alcohol, fluororesins, polycarbonates, polyacetates, polyamides, polyimides; rubber sheets; and their composite structures (for example, a composite sheet of paper sandwiched between aluminum foils), but these are not limitative.

The plastic films may be non-stretched, monoaxially stretched or biaxially stretched. Preferred are biaxially-stretched polyethylene terephthalate films. The polyethylene terephthalate films may have pores therein, for example, as in JP-A 314794/1997.

The thickness of the support for use in the invention may fall between 25 $\mu$m and 3 mm, preferably between 75 $\mu$m and 500 $\mu$m, but the optimum thickness thereof varies depending on the printing condition to be employed. In general, the most preferred range of the thickness of the support falls between 100 $\mu$m and 300 $\mu$m.

For improving its surface adhesiveness and antistatic property, the support may be subjected to surface treatment of, for example, corona discharging, matting to improve adhesiveness, or antistatic treatment.

If desired, a conventional base plate for ordinary lithographic printing plate precursors may be stuck, via an adhesive therebetween, to the back surface of the support opposite to the surface thereof coated with a laminate structure comprising the photo-thermal conversion layer and the silicone rubber layer. Examples of the base plate are metal plates of, for example, aluminum; aluminum-based alloy plates (of, for example, alloys of aluminum with any other metal such as silicon, copper, manganese, magnesium, chromium, zinc, lead, bismuth, nickel); plastic films of, for example, polyethylene terephthalate or polyethylene naphthalate; composite sheets laminated with paper or a plastic film of, for example, polyethylene or polypropylene.

(B) Undercoat Layer:

The waterless lithographic printing plate precursor to be processed in the invention has an undercoat layer formed in a mode of aqueous coating of a water-soluble or water-dispersible polymer-containing coating liquid, between the support (A) described above and the photo-thermal conversion layer (C) to be described hereinunder. The undercoat layer serves as an adhesive layer that enhances the adhesiveness between the support and the photo-thermal conversion layer, and also serves as a cushion layer that relieves the printing pressure to the silicon rubber layer.

The undercoat layer is formed in a mode of aqueous coating of the coating liquid. Therefore, the coating liquid for the layer contains, as the binder, a water-soluble polymer, or a water-dispersible polymer capable of being dispersed in water to form an aqueous emulsion, or both. In order that the undercoat layer formed in such an aqueous coating mode has a uniform constitution, the other components except the binder, such as various additives to the coating liquid for the layer must be soluble in water or must be dispersible in water to form an aqueous emulsion.

An aqueous solution or dispersion containing those components is prepared for the coating liquid for the undercoat layer, and this is applied onto the support and dried to form the intended undercoat layer thereon.

The constituent components of the undercoat layer are described below.

b-1. Binder:

The binder for the undercoat layer includes, for example, proteins such as gelatin, casein; cellulose compounds such as carboxymethyl cellulose, hydroxyethyl cellulose, acetyl cellulose, diacetyl cellulose, triacetyl cellulose; saccharides such as dextran, agar, sodium alginate, starch derivatives; and synthetic polymers such as polyvinyl alcohol, polyvinyl acetate, polyacrylates, polymethacrylates, polystyrene, polyacrylamide, poly-N-vinylpyrrolidone, polyesters, polyurethanes, polyvinyl chloride, polyacrylic acid.

For improving the adhesiveness between the support and the undercoat layer and for preventing the undercoat layer from being blocked in its formation, it is desirable that the undercoat layer has a crosslinking structure. For forming the crosslinking structure in the layer, for example, used are a crosslinking agent and a binder having a crosslinkable group capable of reacting with the agent, and the intended crosslinking structure is formed in the undercoat layer through the reaction of the binder and the crosslinking agent. However, this method is not limitative. In cases where the crosslinking structure is formed in the undercoat layer according to the method, it is desirable that the binder to be used has, as the crosslinkable group, any of a methylol group, a hydroxyl group, a carboxyl group, and a glycidyl group.

b-2. Crosslinking Agent:

For the crosslinking agent which is added to the coating liquid for forming the crosslinking structure in the undercoat layer according to the method as above, for example, usable are those described in C. E. K. Meers & T. H. James's *The Theory of Photographic Process*, 3rd Ed., 1966; U.S. Pat. Nos. 3,316,095, 3,232,764, 3,288,775, 2,732,303, 3,635,718, 3,232,763, 2,732,316, 2,586,168, 3,103,437, 3,017,280, 2,983,611, 2,725,294, 2,725,295, 3,100,704, 3,091,537, 3,321,313, 3,543,292, 3,125,449; and UK 994,869, 1,167, 207.

Typical examples of the crosslinking agent are melamine compounds, aldehyde compounds and their derivatives, active vinyl compounds, active halogen compounds, and epoxy compounds.

The melamine compounds include those having at least two (preferably at least three) methylol groups and/or alkoxymethyl groups in the melamine molecule, and their polycondensates, melamine resins, as well as melamine/urea resins.

Examples of melamine-formalin precondensates for these are dimethylolmelamine, trimethylolmelamine, tetramethylolmelamine, pentamethylolmelamine, and hexamethylolmelamine. They are available on the market, for example, Sumitex Resin M-3, MW, MK and MC (these are all trade names, manufactured by Sumitomo Chemical), which, however, are not limitative.

Examples of the polycondensates are hexamethylolmelamine resins, trimethylolmelamine resins, and trimethyloltrimethoxymethylmelamine resins. They are available on the market, for example, MA-1 and MA-204 (both are trade names, manufactured by Sumitomo Bakelite); Beckamine MA-S, Beckamine APM and Beckamine J-101 (all are trade names, manufactured by Dai-Nippon Ink Chemical Industry); Euroid 344 (trade name, manufactured by Mitsui Toatsu Chemical); and Ohka Resin M31 and Ohka Resin PWP-8 (both are trade names, manufactured by Ohka Shinko). However, these are not limitative.

The melamine compounds for use in the invention preferably have a functional equivalent falling between 50 and 300. The functional equivalent is obtained by dividing molecular weight of the compound by the number of functional groups in one molecule of the compound. The functional group indicates a methylol group and/or an alkoxymethyl group. If a melamine compound of which the functional equivalent is larger than 300 is used for the crosslinking agent in the undercoat layer, the cured density of the layer is low and the mechanical strength thereof is not high. If the amount of the melamine compound of the type in the coating liquid for the layer is increased, the coatability of the coating liquid is worsened. If the cured density of the undercoat layer is low, the undercoat layer is often blocked and scratched in its formation. On the other hand, melamine compounds of which the functional equivalent is smaller than 50 could increase the cured density of the undercoat layer, but they will often worsen the storage stability of the coating liquid. Even when the amount of the melamine compound of the type to be in the coating liquid is reduced, the properties of the coating liquid could not be improved. The amount of the melamine compound to be added to the coating liquid for use in the invention may fall between 0.1 and 100% by weight, preferably between 10 and 90% by weight of the binder in the coating liquid.

Typical examples of the aldehyde compounds and their derivatives are mucochloric acid, mucobromic acid, mucophenoxychloric acid, mucophenoxybromic acid, formaldehyde, glyoxal, monomethylglyoxal, 2,3-dihydroxy-1,4-dioxane, 2,3-dihydroxy-5-methyl-1,4-dioxane succinaldehyde, 2,5-dimethoxytetrahydrofuran, and glutaraldehyde.

Typical examples of the active vinyl compounds are divinylsulfone-N,N'-ethylenebis(vinylsulfonylacetamide), 1,3-bis(vinylsulfonyl)-2-propanol, methylenebismaleimide, 5-acetyl-1,3-diacryloylhexahydro-s-triazine, 1,3,5-triacryloylhexahydro-s-triazine, and 1,3,5-trivinylsulfonylhexahydro-s-triazine.

Typical examples of the active halogen compounds are 2,4-dichloro-6-hydroxy-s-triazine sodium salt, 2,4-dichloro-6-(4-sulfoanilino)-s-triazine sodium salt, 2,-dichloro-6-(2-sulfoethylamino)-s-triazine, and N,N'-bis(2-chloroethylcarbamyl)piperazine.

Typical examples of the epoxy compounds are bis(2,3-epoxypropyl)methylpropylammonium p-toluenesulfonate, 1,4-bis(2',3'-epoxypropyloxy)butane, 1,3,5-triglycidyl isocyanurate, 1,3-glycidyl-5-(y-acetoxy-β-oxypropyl) isocyanurate, sorbitol polyglycidyl ethers, polyglycerol polyglycidyl ethers, pentaerythritol polyglycidyl ethers, diglycerol polyglycidyl ether, 1,3,5-triglycidyl(2-hydroxyethyl) isocyanurate, glycerol polyglycerol ethers, and trimethylolpropane polyglycidyl ethers.

In addition to above, also usable herein are ethyleneimine compounds such as 2,4,6-triethylene-s-triazine, 1,6-hexamethylene-N,N'-bisethyleneurea, bis-β-ethyleneiminoethyl thioether; methanesulfonate compounds such as 1,2-di(methanesulfonoxy)ethane, 1,4-di(methanesulfonoxy)butane, 1,5-(methanesulfonoxy) pentane; carbodiimide compounds such as dicyclohexylcarbodiimide, 1-dicyclohexyl-3-(3-trimethylaminopropyl)carbodiimide hydrochloride; isoxazole compounds such as 2,5-dimethylisoxazole; inorganic compounds such as chromium alum, chromium acetate; dehydration-condensed peptide reagents such as N-carboethoxy-2-isopropoxy-1,2-dihydroquinoline, N-(1-morpholinocarboxy)-4-methylpyridinium chloride; active ester compounds such as N,N'-adipoyldioxydisuccinimide, N,N'-terephthaloyldioxydisuccinimide; isocyanates such as toluene-2,4-diisocyanate, 1,6-hexamethylene-diisocyanate; and epichlorohydrin compounds such as polyamide-polyamide-epichlorohydrin reaction products. However, these are not limitative.

b-3. Metal Oxide Particles:

For improving the adhesiveness between the support and the undercoat layer, for making the undercoat layer antistatic and for preventing the undercoat layer from being blocked in its formation, it is desirable to add metal oxide particles to the undercoat layer. The material of the metal oxide particles includes, for example, $ZnO$, $SnO_2$, $Al_2O_3$, $In_2O_3$, $MgO$, $BaO$, $MoO_3$, $V_2O_5$ and their composite oxides, and/or such metal oxides additionally containing any other hetero atoms. These may be used either singly or as combined.

For the metal oxides, preferred are $ZnO$, $SnO_2$, $Al_2O_3$, $In_2O_3$, and $MgO$; more preferred are $ZnO$, $SnO_2$ and $In_2O_3$; and even more preferred is $SnO_2$.

Examples of the metal oxides additionally containing some other hetero atom are $ZnO$ doped with Al or In; $SnO_2$ doped with Sb, Nb or a halogen element; $In_2O_3$ doped with Sn. In those, the amount of the hetero atom to be doped is at most 30 mol %, preferably at most 10 mol %. If the amount of the hetero atom doped is larger than 30 mol % and if such over-doped metal oxide particles are used, the adhesiveness between the support and the undercoat layer will lower.

The amount of the metal oxide particles that may be in the undercoat layer in the invention falls between 10 and 1000% by weight of the binder in the layer. Preferably, it falls between 100 and 800% by weight. If the amount is smaller than 10% by weight, it may not ensure good adhesiveness between the support and the undercoat layer; but if larger than 1000% by weight, excess metal oxide particles will often peel off from the undercoat layer.

The mean particle size of the metal oxide particles for use in the invention falls between 0.001 and 0.5 μm, preferably between 0.003 and 0.2 μm. If it is smaller than 0.001 μm, it can not ensure good adhesiveness between the support and the undercoat layer; but if larger than 0.5 μm, large metal oxide particles will often peel off from the undercoat layer in the process of producing the printing plate precursors. The mean particle size referred to herein is meant to indicate not only the primary particle size of the metal oxide particles but also the particle size of the particles having a high-order structure.

b-4. Additives (to undercoat layer):

In the invention, the undercoat layer may contain various additives, in addition to the binder and the optional components, crosslinking agent and metal oxide particles. The additives are added to the layer for various purposes. For example, they are for improving the adhesiveness of the layer to the adjacent layers such as the photo-thermal conversion layer and the support, for preventing the layer from being blocked in its formation, for improving the dispersibility of the metal oxide particles in the layer, and for improving the coatability of the coating liquid for the layer. The additives are, for example, blend binder, adhesion promoter, matting agent, surfactant, and dye.

For the blend binder, for example, usable are polymers such as polyvinyl alcohol, modified polyvinyl alcohol, polyvinyl pyrrolidone, polyurethane, polyamide, styrene-butadiene rubber, carboxy-modified styrene-butadiene rubber, acrylonitrile-butadiene rubber, carboxy-modified acrylonitrile-butadiene rubber, polyisoprene, acrylate rubber, polyethylene, chloropolyethylene, chloropolypropylene, vinyl chloride-vinyl acetate copolymer, nitrocellulose, halogenopolyhydroxystyrene, and chloride rubber. The amount of the blend binder to be in the undercoat layer may be determined in any desired manner. So long as it can form a film layer by itself, the blend binder alone may be used for forming the undercoat layer.

The adhesion promoter includes, for example, polymerizable monomers, diazo resins, silane coupling agents, titanate coupling agents, and aluminum coupling agents.

The matting agent includes, for example, inorganic or organic particles having a mean particle size of preferably from 0.5 to 20 μm, more preferably from 1.0 to 15 μm. Especially preferred for it are crosslinked particles of polymethyl methacrylate, polystyrene, polyolefins and their copolymers.

In general, the dry thickness of the undercoat layer preferably falls between 0.01 and 10 μm, more preferably between 0.1 and 5 μm. The undercoat layer having a dry thickness of smaller than 0.01 μm is difficult to form uniformly and the products having it are often uneven; and the undercoat layer having a dry thickness of larger than 10 μm is not good from the economical viewpoint.

(C) Photo-thermal Conversion Layer:

The waterless lithographic printing plate precursor to be processed in the invention has a photo-thermal conversion layer, which has the function of converting the laser rays applied to the precursor for image formation thereon into heat (function of photo-thermal conversion). Any and every known photo-thermal conversion layer having the function and containing polyurethane along with a photo-thermal converting agent dissolved or dispersed in the polyurethane and other components is employable herein, provided that it can be controlled in a condition that portions of a laser-exposed area in a photo-thermal conversion layer in the precursor remain in the photo-thermal conversion layer of the finished printing plate. The amount of portions of the laser-exposed area to remain in the photo-thermal conversion layer in the finished printing plate is preferably at least 0.01 g/m$^2$, more preferably at least 0.1 g/m$^2$, even more preferably at least 0.2 g/m$^2$. If no photo-thermal conversion layer remains in that area in the finished printing plate and if the undercoat layer therein is therefore exposed out, the printing plate could not sufficiently receive ink. In cases where the thickness of the silicone rubber layer to be formed on the photo-thermal conversion layer is 2.0 g/m$^2$ or more for improving the ink repellency of the printing plate, it is desirable that the weight loss of the photo-thermal conversion layer in the finished printing plate is preferably at least 0.5 g/m$^2$ for ensuring good developability of the laser-exposed area of the precursor. More preferably, the weight loss is at least 0.6 g/m$^2$ or more.

c-1. Photo-thermal Converting Agent:

For the photo-thermal converting agent, herein usable are any known substances having the function of converting the laser rays applied to the precursor for image formation thereon into heat (function of photo-thermal conversion). For IR lasers for the laser source, for example, it has heretofore been known that various organic or inorganic substances capable of absorbing the light of which the wavelength range corresponds to that of the lasers used for image formation are usable. They include, for example, IR-absorbing pigments, IR-absorbing dyes, IR-absorbing metals, and IR-absorbing metal oxides.

The photo-thermal converting agent is mixed with other components such as binder and additives, and formed into the photo-thermal conversion layer.

Examples of the photo-thermal converting agent for use herein are various types of carbon black such as acidic carbon black, basic carbon black, neutral carbon black; various types of such carbon black of which the surface is modified or coated for improving their dispersibility; other black pigments such as nigrosines, aniline black, cyanine black; green pigments such as phthalocyanine, naphthalocyanine; as well as carbon graphite, aluminum, iron powder, diamine-type metal complexes, dithiol-type metal complexes, phenolthiol-type metal complexes, mercaptophenol-type metal complexes, arylaluminum metal salts, crystal water-containing inorganic compounds, copper sulfate, chromium sulfide, silicate compounds; metal oxides such as titanium oxide, vanadium oxide, manganese oxide, iron oxide, cobalt oxide, tungsten oxide, indium tin oxide; and hydroxides and sulfates of those metals. Adding some additives such as metal powder of bismuth, tin, tellurium, iron or aluminum to these is also preferred.

Apart from the above, also usable herein are organic dyes such as those described in *Dyes for IR Sensitization* (by Matsuoka, Plenum Press, New York N.Y. (1990)); U.S. Pat. No. 4,833,124; EP 321,923; and U.S. Pat. Nos. 4,772,583, 4,942,141, 4,948,776, 4,948,777, 4,948,778, 4,950,639, 4,912,083, 4,952,552, 5,023,229. However, these are not limitative.

Of the above, especially preferred is carbon black, as its ability to convert light into heat is high and it is economical and easy to handle.

From its production method, carbon black is classified into furnace black, lamp black, channel black, roll black, disc black, thermal black, acetylene black, etc. Various types of furnace black having different particle sizes and different properties are available on the market. Being inexpensive, they are preferred for use herein.

The degree of aggregation of primary particles of carbon black has an influence of the sensitivity of the printing plate precursor. In this respect, carbon black having a high-order structure of which the degree of aggregation of primary particles is high is compared with ordinary low-order structure carbon black when their amount added to the layer is the same. The black density of the printing plate precursor containing the former could not increase to a desired degree and the laser ray absorbance of the precursor lowers, and, as a result, the sensitivity of the precursor lowers. In addition, the aggregated carbon black particles will increase the viscosity of the coating liquid for the photo-thermal conversion layer, or the coating liquid will become thixotropic. If so, the coating liquid is difficult to handle, and the coated layer could not be even. On the other hand, if the oil absorption of carbon black is low, the dispersibility thereof is low. The sensitivity of the printing plate precursor containing the carbon black of the type will also lower. The oil absorption of carbon black indicates the degree of aggregation of primary particles thereof. Concretely, carbon black having a higher degree of oil absorption has a higher degree of aggregation of primary particles; and that having a lower degree of oil absorption has a lower degree of aggregation of primary particles. In the invention, it is desirable to use carbon black having a degree of oil absorption of from 20 to 300 ml/100 g, more preferably from 50 to 200 ml/100 g.

Carbon black products having different particle sizes are available on the market. The size of the primary particles of carbon black also has an influence on the sensitivity of the printing plate precursor that contains it. If the mean diameter of particle of the primary particles of carbon black in the photo-thermal conversion layer is too small, the layer itself would get transparency and thus could not efficiently absorb laser rays applied thereto, and as a result, the sensitivity of the printing plate precursor lowers. On the other hand, if the particles are too large, they may not be densely dispersed in the layer and the degree of black color of the layer would not increase, and as a result, the layer would not efficiently absorb laser rays applied thereto. In this case, the sensitivity of the printing plate precursor also lowers. Accordingly, in the invention, it is desirable to use carbon black of which the mean particle size of the primary particles is between 10 and 50 nm, more preferably between 15 and 45 nm.

Using electroconductive carbon black in the photo-thermal conversion layer is also preferred, due to increasing the sensitivity of the printing plate precursor. Preferably, the electroconductivity of the carbon black of the type for use herein falls between 0.01 and 100 $\Omega^{-1}$ cm$^{-1}$, more preferably between 0.1 and 10 $\Omega^{-1}$ cm$^-$. Concretely, preferred for use herein are Conductex 40–220, Conductex 975 Beads, Conductex 900 Beads, Conductex SC, and Battery Black (all trade names, manufactured by Columbia Carbon Japan); #3000 (trade name, manufactured by Mitsubishi Chemical); Denkablack (trade name, manufactured by Denki Kagaku Kogyo); and Vulcan XC-72R (trade name, manufactured by Cabbot).

The amount of the photo-thermal converting agent to be in the photo-thermal conversion layer may fall between 1 and 70% by weight, preferably between 5 and 50% by weight of the composition for the layer. If it is smaller than 1% by weight, the sensitivity of the printing plate precursor will be low; but if larger than 70% by weight, the film strength of the layer will be low and, in addition, the adhesiveness of the layer to the adjacent layers will be low.

c-2. Binder:

For the binder to be in the photo-thermal conversion layer, preferred is polyurethane resin as ensuring good adhesiveness of the layer to the silicone rubber layer and to the undercoat layer. In cases where the photo-thermal conversion layer contains polyurethane serving as an additive thereto, any known binder capable of dissolving or dispersing the photo-thermal converting agent may be used in the layer.

The polyurethane resin to be in the photo-thermal conversion layer may be prepared through addition polymerization of a diisocyanate compound and a diol compound. The diisocyanate compound includes, for example, aromatic diisocyanate compounds such as 2,4-tolylene diisocyanate, 2,4-tolylene diisocyanate dimer, 2,6-tolylene diisocyanate, p-xylylene diisocyanate, m-xylylene diisocyanate, 4,4'-diphenylmethane diisocyanate, 4,4'-(2,2-diphenylpropane) diisocyanate, 1,5-naphthylene diisocyanate, 3,3'-dimethylbiphenyl-4,4' diisocyanate; aliphatic diisocyanate compounds such as hexamethylene diisocyanate, trimethyl-hexamethylene diisocyanate, lysine diisocyanate, dimeric acid diisocyanate; alicyclic diisocyanate compounds such as isophorone diisocyanate, 4,4'-methylenebis (cyclohexyl isocyanate), methylcyclohexane-2,4 (or 2,6) diisocyanate, 1,3-(isocyanatomethyl)cyclohexane; and reaction products of diols with diisocyanates such as adduct of 1,3-butylene glycol (1 mol) with tolylene diisocyanate (2 mols).

The diol compound includes, for example, ethylene glycol, diethylene glycol, triethylene glycol, tetraethylene glycol, polyethylene glycol, propylene glycol, 1,2-dipropylene glycol, 1,2-tripropylene glycol, 1,2-tetrapropylene glycol, 1,3-dipropylene glycol, polypropylene glycol, 1,3-butylene glycol, 1,3-dibutylene glycol, neopentyl glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, bisphenol A, hydrogenated bisphenol A, hydrogenated bisphenol F, bisphenol S, hydroquinone dihydroxyethyl ether, p-xylylene glycol, dihydroxyethyl sulfone, 2,2'-dimethylolpropanoic acid, bis(2-hydroxyethyl)-2,4-tolylene dicarbamate, 2,4-tolylene-bis(2-hydroxyethylcarbamide), bis(2-hydroxyethyl)-m-xylylene dicarbamate, bis(2-hydroxyethyl) isophthalate. It further includes polyethers obtained through condensation of those diol compounds; and polyester diols obtained through condensation of dicarboxylic acids, such as adipic acid or terephthalic acid, with those diol compounds.

In producing the polyurethane resins, usable is a chain extender of, for example, diamine compounds, hydrazine or hydrazine derivatives.

Examples of known binders usable herein apart from polyurethane are cellulose and cellulose derivatives such as nitrocellulose, ethyl cellulose; homopolymers and copolymers of vinyl compounds such as vinyl halides, vinyl ethers, vinyl esters (e.g., polyvinyl acetate), vinyl ketones; homopolymers and copolymers of styrenic monomers, such as polystyrene, poly-α-methylstyrene; homopolymers and copolymers of acrylates and methacrylates (e.g., polymethyl methacrylate); homopolymers and copolymers of acrylamides and methacrylamides; ethylene-vinyl acetate copolymers and their saponified products; copolymers of, for example, ethylene-acrylic acid or ethylene-methacrylic acid; synthetic rubbers such as ethylene-α-olefin copolymer elastomers, isoprene rubber, styrene-butadiene rubber; other rubbers such as rubber chloride, natural rubber; other polymers such as polyethylene, polypropylene, acid-modified polyolefins, polysulfones, polyacetals, polyphenylene oxides, polyureas, polyamides, polyesters, polycarbonates, phenolic resins; as well as binders used for "chemical extenders", such as those described in *J. Imaging Sci.*, p. 59–64, 30(2), 1986 (by Frechet et al.), *Polymers in Electronics* (Symposium Series, p. 11, 242, T. Davidson, Ed., ACS Washington, D.C., 1984, Ito, Wilson), and *Microelectronic Engineering*, p. 3–10, 13, 1991 (by E. Reichmanis, L. F. Thompson). However, these are not limitative.

One or more of these binders may be used herein either singly or as combined.

c-3. Additives (to photo-thermal conversion layer):

In addition to the above-described, photo-thermal converting agent c-1 and binder c-2, the photo-thermal conversion layer may contain any other additives. The additives are for increasing the mechanical strength of the layer, improving the sensitivity of the layer to lasers, improving the dispersibility of the components in the layer, and improving the adhesiveness of the layer to the adjacent layers such as the undercoat layer, interlayer and silicone rubber layer, and are suitably added to the layer in accordance with their purposes.

For example, for increasing the mechanical strength of the photo-thermal conversion layer, various crosslinking agents may be used to cure the layer. The crosslinking agents may be, for example, combinations of a polyfunctional isocyanate compound or a polyfunctional epoxy compound, and any of hydroxyl group-having compounds, carboxylic acid compounds, thiol compounds, amine compounds or urea compounds, but are not limited thereto.

The amount of the crosslinking agent that may be used for the photo-thermal conversion layer may fall between 1 and 50% by weight, preferably between 2 and 20% by weight of the composition to form the layer. If its amount is smaller than 1% by weight, the crosslinking agent will be ineffective; but if larger than 50% by weight, the mechanical strength of the cured layer will increase too high, and the layer will lose the ability to absorb the shock of external pressure applied to the silicone rubber layer, and, as a result, its scratch resistance will lower.

Any known compound that generates gas when decomposed under heat may be added to the photo-thermal conversion layer for improving the laser-recording sensitivity of the layer. When the layer contains such an additive, its volume may expand greatly to improve the laser-recording sensitivity of the layer. Examples of the additive are dinitropentamethylenetetramine, N,N'-dimethyl-N,N'-dinitrosoterephthalamide, p-toluenesulfonylhydrazide, 4,4-oxybis(benzensulfonylhydrazide), and diamidobenzene.

Also for improving the laser-recording sensitivity of the photo-thermal conversion layer, any known thermal acid-generating agent that decomposes under heat to give an acidic compound may be added to the layer. It includes, for example, various iodonium salts, sulfonium salts, phosphonium tosylates, oxime sulfonates, dicarbodiimidosulfonates, and triazines. When combined with the chemical extender binder in the photo-thermal conversion layer, the agent significantly lowers the decomposition point of the chemical extender binder in the layer, thereby improving the laser-recording sensitivity of the layer.

In cases where the photo-thermal conversion layer contains a pigment such as carbon black that serves as the photo-thermal converting agent therein, a dispersant for the pigment may be added to the layer for improving the dispersibility of the pigment in the layer.

The amount of the pigment dispersant that may be in the photo-thermal conversion layer may fall between 1 and 70% by weight, preferably between 5 and 50% by weight of the photo-thermal converting agent in the layer. If its amount is smaller than 1% by weight, the dispersant will be ineffective for improving the dispersibility of the pigment in the layer, and the sensitivity of the plate precursor will be low; but if larger than 70% by weight, the adhesiveness of the layer to the adjacent layers will be low.

For improving the adhesiveness of the photo-thermal conversion layer to the adjacent layers, a known adhesiveness improver of, for example, silane coupling agents or titanate coupling agents; as well as a binder having the ability to increase layer-to-layer adhesiveness may be added to the photo-thermal conversion layer. The binder includes, for example, vinyl group-having acrylate resins, hydroxyl group-having acrylate resins, acrylamide resins, ethylene-vinyl acetate copolymers, vinyl chloride-vinyl acetate copolymers, cellulose derivatives, and gelatin.

The amount of the adhesiveness improver and the adhesiveness-improving binder that may be added to the photo-thermal conversion layer may fall between 5 and 70% by weight, preferably between 10 and 50% by weight of the composition to form the layer. If its amount is smaller than 5% by weight, the improver or binder will be ineffective for improving the adhesiveness of the photo-thermal conversion layer to the adjacent layers; but if larger than 70% by weight, the sensitivity of the printing plate precursor will lower.

For improving the coatability of the coating liquid for the photo-thermal conversion layer, a surfactant such as fluorine-containing surfactant or nonionic surfactant may be added to the coating liquid.

The amount of the surfactant that may be added to the coating liquid may fall between 0.01 and 10% by weight, preferably between 0.05 and 1% by weight of the coating liquid to form the layer. If it is smaller than 0.01% by weight, the coatability of the coating liquid will be poor and the coating liquid may not form a uniform photo-thermal conversion layer; but if larger than 10% by weight, the adhesiveness of the photo-thermal conversion layer to the adjacent layers will lower.

Apart from the above, other various additives maybe added to the photo-thermal conversion layer.

The thickness of the photo-thermal conversion layer may fall between 0.05 and 10 $g/m^2$, preferably between 0.1 and 5 $g/m^2$. If the layer is too thin, it could not ensure good optical density and its laser-recording sensitivity will lower. If so, the layer could not be even and will often lower the quality of the image formed. On the other hand, if the layer is too thick, it is unfavorable, since its laser-recording sensitivity will lower and its production costs will increase.

The photo-thermal conversion layer may be formed by applying the coating liquid for the layer onto the surface of the undercoat layer (B) formed on the support (A). For forming it, employable are any known methods. For example, the coating liquid may be applied onto the surface of the undercoat layer in any method of dipping, air-knife coating, curtain coating, wire-bar coating, gravure coating or extrusion coating, and dried to form thereon the intended, photo-thermal conversion layer.

(D) Silicone Layer:

The printing plate precursor to be processed in the invention has an ink-repellent silicone rubber layer of a silicone rubber film formed on the photo-thermal conversion layer (C). Concretely, it is desirable that the layer is formed by curing a condensation-curable silicone with a crosslinking agent, or by additional polymerizing an addition-polymerizable silicone in the presence of a catalyst.

In the former case of curing a condensation-curable silicone to form the layer, preferably used is a composition comprising (a) 100 parts by weight of a diorganopolysiloxane, (b) from 3 to 70 parts by weight of a condensation-crosslinking agent, and (c) from 0.01 to 40 parts by weight of a catalyst.

The component (a), diorganopolysiloxane is a polymer having repetitive units of a general formula described below. In the formula, $R^1$ and $R^2$ each represent an alkyl group having from 1 to 10 carbon atoms, a vinyl group, or an aryl group, and they may have any other suitable substituents. In general, it is desirable that at least 60% of $R^1$ and $R^2$ are methyl groups, or halogenovinyl groups, or halogenophenyl groups.

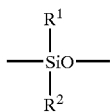

Preferably, the diorganopolysiloxanes of the type for use herein are terminated with a hydroxyl groups at the two ends.

The number-average molecular weight of the component (a) preferably falls between 3,000 and 600,000, more preferably between 5,000 and 100,000.

The component (b), crosslinking agent may be any one and every one capable of crosslinking the component (a) through condensation. For it, for example, preferred are those of the following general formula:

(m+n=4, n=at least 2)

In this, $R^1$ has the same meaning as above; and X represents a halogen atom such as Cl, Br or I, or a hydrogen atom, a hydroxyl group, or an organic substituent of any of the following:

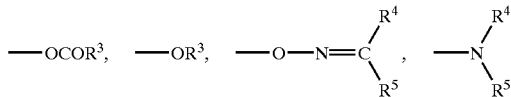

In these, $R^3$ represents an alkyl group having from 1 to 10 carbon atoms, or an aryl group having from 6 to 20 carbon atoms; and $R^4$ and $R^5$ each represent an alkyl group having from 1 to 10 carbon atoms.

The component (c) may be any known catalyst, including, for example, metal carboxylates with tin, zinc, lead, calcium, manganese or the like, such as dibutyl laurate, lead octylate, lead naphthenate, as well as chloroplatinic acid.

In the other case of using an addition-polymerizable silicone to form the silicone rubber layer, preferably used is a composition comprising (d) 100 parts by weight of a diorganopolysiloxane having an addition-reactive functional group, (e) from 0.1 to 25 parts by weight of an organohydrogenpolysiloxane, and (f) from 0.00001 to 1 part by weight of a catalyst for addition reaction.

The component (d), diorganopolysiloxane having an addition-reactive functional group is an organopolysiloxane having, in one molecule, at least two alkenyl groups (more preferably, at least two vinyl groups) directly bonding to the silicon atom in the molecule, in which the alkenyl groups may be in any site of the terminals of the molecule or the midstream thereof. In addition to the alkenyl groups, the compound may have any other organic group such as substituted or unsubstituted alkyl or aryl group having from 1 to 10 carbon atoms. Further, the component (d) may have a minor amount of hydroxyl group. The number-average molecular weight of the component (d) preferably falls between 3,000 and 600,000, more preferably between 5,000 and 150,000.

Examples of the component (e) are polydimethylsiloxanes terminated with a hydride group at both ends; α,ω-dimethylpolysiloxanes; methylsiloxane/dimethylsiloxane copolymers terminated with a methyl group at both ends; cyclic polymethylsiloxanes; polymethylsiloxanes terminated with a trimethylsilyl group at both ends; and dimethylsiloxane/methylsiloxane copolymers terminated with a trimethylsilyl group at both ends.

The component (f) may be selected from known polymerization catalysts in any desired manner, for which, however, preferred are platinum compounds. Its examples are platinum in the form of a simple substance thereof, platinum chloride, chloroplatinic acid, and olefin-coordinated platinum complexes.

A crosslinking inhibitor may be added to the composition for controlling the curing rate of the composition to form the silicone rubber layer. The crosslinking inhibitor includes, for example, vinyl group-having organopolysiloxanes such as tetracyclo(methylvinyl)siloxane; as well as carbon—carbon triple bond-having alcohols, acetone, methyl ethyl ketone, methanol, ethanol, and propylene glycol monomethyl ether.

The silicone rubber layer (D) is formed on the photo-thermal conversion layer (C) by applying the above-described, silicone-containing composition in a solvent onto the layer (C) followed by drying it thereon. In the step of drying the silicone rubber layer-forming composition having been coated on the layer (C) to remove the solvent, the composition undergoes condensation reaction or addition reaction to form a film of the intended silicone rubber layer on the layer (C). Therefore, in this step, if the drying temperature is too low, the composition could not well cure and will fail to form a good silicone rubber layer. Accordingly, the drying temperature of the coating layer of the composition to form the silicone rubber layer is preferably not lower than 80° C., more preferably not lower than 100° C.

To the silicone rubber layer, if desired, optionally added are any of fine inorganic powder of, for example, silica, calcium carbonate or titanium oxide; an adhesion promoter such as a silane coupling agent, a titanate coupling agent or an aluminum coupling agent; and a photopolymerization initiator.

The dry thickness of the silicone rubber layer preferably falls between 0.5 and 5.0 g/m², more preferably between 1.0 and 3.0 g/m², even more preferably between 2.0 and 2.5 g/m². If the dry thickness of the layer is smaller than 0.5 g/m², some problems will occur in that the ink repellency of the layer lowers and the layer will be readily scratched; but if larger than 5.0 g/m², the developability of the layer will greatly lower.

If desired, the silicone rubber layer may be further coated with any other silicone rubber layers to be a topcoat layer thereon, for improving its printing durability, scratch resistance, image reproducibility and stain resistance.

(E) Other Layers:

In addition to the above-described layers, the waterless lithographic printing plate precursor to be processed in the invention may have any other layers not interfering with the effect of the invention, in accordance with the object of the invention. The additional layers are described below.

(E-1) Interlayer:

In the invention, an interlayer may be formed in an aqueous coating mode, between the undercoat layer (B) and the photo-thermal conversion layer (C). The interlayer is essentially for assisting the function of preventing the metal oxide particles of the undercoat layer from being peeled off while the precursor is produced and for improving the slidability and the scratch resistance of the precursor in its production.

e-1-1. Binder:

The binder for the interlayer may be the same as that for the undercoat layer.

For it, in addition, further usable are <1> waxes, resins and rubber-like substances of homopolymers or copolymers of 1-olefinic unsaturated hydrocarbons such as ethylene, propylene, 1-butene and 4-methyl-1-pentene (e.g., polyethylene, polypropylene, poly-1-butene, poly-4-methyl-1-pentene, ethylene/propylene block copolymer, ethylene/1-butene copolymer, propylene/1-butene copolymer); <2> rubber-like copolymers of two or more of the above-described 1-olefins with conjugated or non-conjugated dienes (e.g., ethylene/propylene/ethylidenenorbornene copolymers, ethylene/propylene/1,5-hexadiene copolymer, isobutene/isoprene copolymer); <3> copolymers of 1-olefins with conjugated or non-conjugated dienes (e.g., ethylene/butadiene copolymer, ethylene/ethylidenenorbornene copolymer); <4> copolymers of 1-olefins, especially ethylene with vinyl acetate, and their completely or partially saponified products; and <5> graft polymers of 1-olefin homopolymers or copolymers grafted with the above-described, conjugated or non-conjugated dienes or vinyl acetate, and their completely or partially saponified products.

The binder for the interlayer must be soluble in water or dispersible in water to form an aqueous emulsion. For it, especially preferred are polymer latexes of acrylic resins, vinyl resins, polyurethane resins and polyester resins, as well as water-soluble polyolefin resins.

e-1-2. Additives (to interlayer)

Like the undercoat layer, the interlayer may also contain various additives such as a matting agent and surfactant.

The thickness of the interlayer preferably falls between 0.01 and 1 μm, more preferably between 0.01 and 0.2 μm. The interlayer having a thickness of smaller than 0.01 μm is difficult to form uniformly and the products having it are often uneven; and the interlayer having a thickness of larger than 1 μm is not good from the economical viewpoint.

(E-2) Back Coat Layer:

In the waterless lithographic printing plate precursor to be processed in the invention, a back coat layer may be disposed on the other surface of the support (A) opposite to the surface thereof coated with the photo-thermal conversion layer (C) and the silicone rubber layer (D).

The back coat layer is effective for reducing blocking of the waterless lithographic printing plate precursors and the resulting printing plates when piled up, and for reducing their blocking to the surface of processing devices which may occur in the laser-writing step and the developing step for processing the precursors and in the printing step of using the printing plates. If containing an antistatic agent, the back coat layer may additionally have the function of preventing static electrification.

For preventing the antistatic agent from dropping out of the back coat layer, a protective layer may be provided on the back coat layer. One or more such protective layers may be provided thereon.

The formulation of the back coat layer may be the same as that of the undercoat layer (B) described above; and the formulation of the protective layer may be the same as that of the interlayer (E-1) described above. In the invention, the back coat layer and the protective layer do not require aqueous coating. For forming them, for example, a binder and other various components may be dissolved and/or dispersed in any desired organic solvent, and the resulting coating liquids may be applied onto the support or onto the underlying layer, and then dried thereon.

For reducing blocking of the plates, it is desirable to add a matting agent to the back coat layer and/or the protective layer. The matting agent may be inorganic or organic particles preferably having a mean particle size of from 0.5 to 20 μm, more preferably from 1.0 to 15 μm. For it, especially preferred are crosslinked particles of polymethyl methacrylate, polystyrene, polyolefins and their copolymers.

Next described is a plate-making method of processing the waterless lithographic printing plate precursor. Like ordinary ones, the plate-making method comprises an exposing step of imagewise exposing the precursor to thereby lower the adhesiveness of the silicone rubber layer to the adjacent layers in the exposed area; and a developing step of removing the silicone rubber layer of which the adhesiveness has been lowered to thereby form an ink-receiving region in that area.

(I) Exposing Step:

In the plate-making method of the invention, it is a matter of importance that a part of the photo-thermal conversion layer in the laser-exposed area of the precursor remains in the finished printing plate, as so described hereinabove. Therefore, the laser to be used for exposing the waterless lithographic printing plate precursor to it must be enough to lead to the result that the adhesiveness of the silicone rubber layer to the adjacent layers is fully lowered in the laser-exposed area so that it can be peeled and removed from the adjacent layers in that area, and that the photo-thermal conversion layer still remains in that area in the finished printing plate. By controlling the laser output in accordance with the composition and the thickness of the photo-thermal conversion layer, or by controlling the essential scanning rate (image-writing rate) of the laser, the amount of the photo-thermal conversion layer to remain in the finished printing plate can be readily controlled. So far as it satisfies the above-described conditions, the laser for use herein is not specifically defined in point of its source, etc. For example, herein employable are gas lasers such as Ar laser, carbon dioxide laser; solid lasers such as YAG laser; and semiconductor lasers. In general, the laser output must be at least 50 mW. From the economical viewpoint of maintenance and cost, preferred are semiconductor lasers and semiconductor-excited solid lasers (e.g., YAG laser).

The recording wavelength of these lasers falls within an IR wavelength range, and an oscillation wavelength in a range between 800 nm and 1100 nm from lasers is preferably used in the invention.

The imaging device described in JP-A 186750/1994, as well as Heidelberg's full-color printing system Quickmaster DI46-4 (trade name), may also be used in the invention for exposing the printing plate precursor to light. Also in this case, it is important to control the photo-thermal conversion layer to remain in the finished printing plate, by controlling the laser thickness of the photo-thermal conversion layer in the precursor to be processed.

(II) Developing Step:

The developer to be used in processing the waterless lithographic printing plate precursor in the invention may be any and every conventional one for processing ordinary waterless lithographic printing plate precursors, including, for example, hydrocarbons, polar solvents, water, and their combinations. For ensuring safety, preferred are water, and aqueous solutions consisting essentially of water and containing an organic solvent. Especially for safety from fire, the concentration of the organic solvent in the developer is preferably lower than 40% by weight.

The hydrocarbons usable herein include aliphatic hydrocarbons (concretely, for example, hexane, heptane, gasoline, kerosene, other commercial solvents, ISOPAR E™, H™, G™ (all manufactured by of Exxon Chemicals)); aromatic hydrocarbons (e.g., toluene, xylene); and halogenohydrocarbons (e.g., trichlene). The polar solvents also usable herein include alcohols (concretely, for example, methanol, ethanol, propanol, isopropanol, benzyl alcohol, ethylene glycol monomethyl ether, 2-ethoxyethanol, diethylene glycol monomethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol); ketones (e.g., acetone, methyl ethyl ketone); esters (e.g., ethyl acetate, methyl lactate, butyl lactate, propylene glycol monomethyl ether acetate, diethylene glycol acetate, diethyl phthalate); and triethyl phosphate, tricresyl phosphate. Water alone, such as tap water, pure water or distilled water may also be used for the developer. These may be used either singly or as combined, for example, by adding water to hydrocarbons or to polar solvents or by combining hydrocarbons and polar solvents.

To those of hydrocarbons and polar solvents not having good affinity for water, surfactant may be added to increase their solubility in water. Along with surfactant, alkali (e.g., sodium carbonate, diethanolamine, sodium hydroxide) may also be added to them.

After exposure to light, the printing precursor may be developed in any known manner, for example, by rubbing its surface with a developing pad containing a developer such as that described above, or by pouring the developer onto its surface followed by rubbing the surface with a developing brush in water. The temperature of the developer is not specifically defined, but preferably falls between 10° C. and 50° C. Having been thus processed, the silicone rubber layer, or that is, the ink-repellent layer is removed from the image area, and the image area with no silicone rubber layer therein is to receive ink.

The development and the subsequent treatment of washing the plate in water and drying it may be effected in an automatic processing machine. One preferred example of the automatic processing machine is described in JP-A 220061/1990. Also preferred for the processing treatment is the above-described, Heidelberg's full-color printing system, Quickmaster DI46-4 (trade name), as it furnishes good conditions for continuous exposure and in-line development.

For developing the exposed precursor, an adhesive layer maybe stuck to the surface of the silicone rubber layer thereof, and the adhesive layer is peeled off. The adhesive layer may be any known one capable of being stuck to the silicone rubber layer. For example, a commercial product, Sumitomo MMM's SCOTCH TAPE #851A™ provides the adhesive layer of the type disposed on a flexible support.

In cases where the thus-processed, waterless lithographic printing plates are piled up in storage, it is desirable to put some protective paper between all the adjacent plates for protecting the printing face of each plate.

The waterless lithographic printing plate produced according to the plate-making method of the invention is set in a printer, and it gives a large number of good prints as the ink adhesion to the image area thereof is good.

EXAMPLES

The invention is described in more detail with reference to the following Examples, which, however, are not intended to restrict the scope of the invention. In the following, "part" and "%" are all by weight.

Examples 1 to 10

Comparative Examples 1 to 5

1. Formation of Undercoat Layer (B):

A coating liquid described below was applied onto the surface of a polyester film (A) (trade name: E-5101, from Toyobo) having a thickness of 188 μm and having been treated through corona discharging, according to a wire bar coating method, and dried at 180° C. for 30 seconds to form thereon an undercoat layer having a dry thickness of 0.2 μm. Coating Liquid for Undercoat Layer:

| | |
|---|---|
| Aqueous dispersion of acrylic resin (trade name: ET-410, from Nippon Junyaku's Julimer; solid content 20% by weight) | 7 parts |
| Aqueous dispersion of tin oxide-antimony oxide (mean particle size 0.1 μm; 17% by weight) | 10 parts |
| Epoxy compound (trade name: EX-614B, from Nagase Kasie's Denacole; effective ingredient concentration 100% by weight) | 1.0 wt. pt. |
| Colloidal silica (trade name: Snowtex C, from Nissan Chemicals; 20% by weight) | 1.2 parts |
| Aqueous solution of sodium alkylsulfonate (Sanyo Kasei's Sanded BL (trade name); 44% by weight) | 0.6 parts |
| Surfactant, polyoxyethylene alkylphenyl ether (Kao's Emulgen 911 (trade name)) | 2.0 parts |
| Distilled water | 80 parts |

2. Formation of Interlayer:

According to a wire bar coating method, a coating liquid described below was applied onto the undercoat layer (B), and dried at 170° C. for 30 seconds to form an interlayer having a dry thickness of 0.05 μm to form a interlayer (E-1). Coating Liquid for Interlayer:

| | | |
|---|---|---|
| Polyolefin latex (Mitsui Chemical's Chemipearl S-120 (trade name); solid content 27% by weight) | 16 | parts |
| Melamine compound (Sumitomo Chemical's Sumitex Resin M-3 (trade name); effective ingredient concentration 80% by weight) | 0.2 | parts |
| Aqueous solution of sodium alkylsulfonate (Sanyo Kasei's Sanded BL (trade name); 44% by weight) | 0.6 | parts |
| Polymethacrylic resin matting agent (Soken Chemical's MX-500 (trade name); mean particle size 5.0 μm) | 0.14 | parts |
| Distilled water | 80 | parts |

3. Formation of Photo-thermal Conversion Layer (C):

A liquid mixture described below was stirred along with glass beads in a paint shaker for 30 minutes to thereby disperse carbon black therein; then the glass beads were removed through filtration; and 0.005 g of a fluorine-containing surfactant (Megafac F177 (trade name) from Dai-Nippon Ink Chemical) was added thereto and stirred to prepare a coating liquid for photo-thermal conversion layer.

The coating liquid was applied onto the interlayer to give a dry thickness indicated in Table 1 below, and dried under heat at 80° C. for 2 minutes to form thereon a photo-thermal conversion layer.
Coating Liquid for Photo-thermal Conversion Layer:

| | |
|---|---|
| Polyurethane (Sanyo Kasei's Coatlon MW-060 (trade name)) | 4.0 parts |
| Carbon black (Mitsubishi Chemical's MA-220 | 1.0 parts |

-continued

| | |
|---|---|
| (trade name)) | |
| Ultra-dispersant (ICI's Solsperse S24000R (trade name)) | 0.2 parts |
| Propylene glycol monomethyl ether | 100.0 parts |

4. Formation of Silicone Rubber Layer (D):

A coating liquid for silicone rubber layer described below was applied onto the photo-thermal conversion layer (C) and dried under heat at 100° C. for 1 minutes to form thereon an adduct-type silicone rubber layer having a dry thickness of 2.0 g/m².

Coating Liquid for Silicone Rubber Layer:

| | |
|---|---|
| α,ω-divinylpolydimethylsiloxane (degree of polymerization: 1500) | 9.0 parts |
| $(CH_3)_3SiO(SiH(CH_3)O)_8$—$Si(CH_3)_3$ | 0.2 parts |
| Olefin-chloroplatinic acid | 0.1 parts |
| Reaction inhibitor [HC≡C—C(CH_3)_2—O—Si(CH_3)_3] | 0.2 parts |
| Aliphatic hydrocarbon solvent (Exxon Chemical's ISOPAR G ™ | 120.0 parts |

According to the process as above, obtained were waterless lithographic printing plate precursors having good interlayer adhesiveness. These were processed under the plate-making condition described below into waterless lithographic printing plates of Examples 1 to 10 and Comparative Examples 1 to 5.

5. Plate-Making Process, and Evaluation of Waterless Lithographic Printing Plates;

Imagewise Exposure

Using a semiconductor laser having a wavelength of 830 nm and a beam diameter of 28 μm ($1/e^2$), of which the output is indicated in Table 1 below, an image was written on each of the waterless lithographic printing plate precursors obtained as above, at a writing speed of 2.0 m/sec.

Development

Subsequently to this, the surface of each precursor was wiped with a developing pad containing an aqueous surfactant solution to thereby remove the silicone rubber layer in the laser-exposed area of the precursor. In that manner, the precursors were processed into waterless lithographic printing plates.

Measurement of Photo-thermal Conversion Layer Remaining in Finished Printing Plates The weight of the solid-written part of each of the waterless lithographic printing plates thus obtained in the process of imagewise exposing the precursors to laser followed by developing them was measured. Then, the printing plates were dipped in a mixed solution of MEK/DMSO=1/1 for 10 minutes to thereby dissolve and remove the photo-thermal conversion layer, the undercoat layer and the interlayer remaining in them. After dried, the weight of the support alone of each sample was measured. The weight of the photo-thermal conversion layer having remained in the laser-exposed area in the finished printing plate was obtained by subtracting the total of the weight of the support thus measured and the weight of the undercoat layer and the interlayer formed in the precursor, from the weight of the solid-written part of the finished printing plate measured in the above. The data thus obtained are given in Table 1.

Evaluation of Ink Adhesiveness to Image Area of Printing Plate:

The thus-obtained, waterless lithographic printing plate was tried in a printer to give 1000 prints. These prints were visually checked for the ink density in the solid image area of each print. The result is given in Table 1.

Ink Density Rank (A and B are acceptable in practical use)

A: The Image Density is High and Good
B: The image density is not so high, but has no negative influence on the image quality.
C: The image density is low, and has a negative influence on the image quality.
D: The image density is very low.

TABLE 1

| Sample | Thickness of Photo-thermal Conversion Layer | Laser Power | Amount of Photo-thermal Conversion Layer having remained in finished printing plate | Ink Density in Image Area |
|---|---|---|---|---|
| Example 1 | 0.5 g/m² | 100 mW | 0.3 g/m² | A |
| Example 2 | 0.5 g/m² | 300 mW | 0.1 g/m² | B |
| Comp. Ex. 1 | 0.5 g/m² | 500 mW | 0 g/m² | D |
| Comp. Ex. 2 | 0.5 g/m² | 700 mW | 0 g/m² | D |
| Comp. Ex. 3 | 0.5 g/m² | 900 mW | 0 g/m² | D |
| Example 3 | 1.0 g/m² | 100 mW | 0.8 g/m² | A |
| Example 4 | 1.0 g/m² | 300 mW | 0.6 g/m² | A |
| Example 5 | 1.0 g/m² | 500 mW | 0.3 g/m² | A |
| Comp. Ex. 4 | 1.0 g/m² | 700 mW | 0 g/m² | D |
| Comp. Ex. 5 | 1.0 g/m² | 900 mW | 0 g/m² | D |
| Example 6 | 2.0 g/m² | 100 mW | 1.8 g/m² | A |
| Example 7 | 2.0 g/m² | 300 mW | 1.6 g/m² | A |
| Example 8 | 2.0 g/m² | 500 mW | 1.3 g/m² | A |
| Example 9 | 2.0 g/m² | 700 mW | 0.9 g/m² | A |
| Example 10 | 2.0 g/m² | 900 mW | 0.5 g/m² | A |

From Table 1, it is understood that the waterless lithographic printing plates, which are obtained according to the plate-making method of the invention and for which the precursors are exposed to light under the condition under which the photo-thermal conversion layer partly remains in the exposed area of the finished plates, well receive ink to give good prints of high image density. In addition, it is also understood that the amount of the photo-thermal conversion layer to remain in the finished printing plates can be controlled by controlling the thickness of the layer in the precursors and controlling the laser output to be applied to the precursors.

Examples 11 to 13

Comparative Examples 6 and 7

Waterless lithographic printing plate precursors for Examples 11 to 13 and Comparative Examples 6 and 7, all having good interlayer adhesiveness, were fabricated in the same manner as in Example 3, for which, however, used was a silicone rubber layer (D) described below in place of the silicone rubber layer (D) used in the precursor in Example 3.

Coating Liquid for Silicone Rubber Layer:

| | |
|---|---|
| Dimethylpolysiloxane terminated with hydroxyl group at both ends (degree of polymerization: 700) | 9 parts |
| Methyltriacetoxysilane | 0.5 parts |
| Dibutyltin dioctanoate | 0.2 parts |
| Aliphatic hydrocarbon solvent (Exxon Chemical's ISOPAR G ™) | 160 parts |

These precursors were processed under the same condition as that for the precursors in Examples 3 to 5 and Comparative Examples 4 and 5, and the resulting printing plates were evaluated in the same manner as above. The result is given in Table 2 below.

TABLE 2

| Sample | Thickness of Photo-thermal Conversion Layer | Laser Power | Amount of Photo-thermal Conversion Layer having remained in finished printing plate | Ink Density in Image Area |
|---|---|---|---|---|
| Example 11 | 1.0 g/m$^2$ | 100 mW | 0.8 g/m$^2$ | A |
| Example 12 | 1.0 g/m$^2$ | 300 mW | 0.6 g/m$^2$ | A |
| Example 13 | 1.0 g/m$^2$ | 500 mW | 0.3 g/m$^2$ | A |
| Comp. Ex. 6 | 1.0 g/m$^2$ | 700 mW | 0 g/m$^2$ | D |
| Comp. Ex. 7 | 1.0 g/m$^2$ | 900 mW | 0 g/m$^2$ | D |

According to the plate-making method of the invention, the printing plates produced all enjoyed good ink adhesion to the image area thereof even when the ink-repellent silicone rubber layers in them differ. The waterless lithographic printing plates of Examples 11 to 13 are all good, like those of Examples 3 to 5.

Examples 14 to 17

Comparative Example 8

Waterless lithographic printing plate precursors all having good interlayer adhesiveness were fabricated in the same manner as in Example 3, for which, however, used were an undercoat layer (B) and a photo-thermal conversion layer (C) both described below, in place of the undercoat layer (B), the interlayer (E-1) and the photo-thermal conversion layer (C) used in the precursor in Example 3.

Coating Liquid for Undercoat Layer:

| | |
|---|---|
| Polyester latex (Takamatsu Yuship's Pesuresin A-520 (trade name); solid content 30% by weight) | 8 parts |
| Melamine compound (Sumitomo Chemical's Sumitex Resin M-3 (trade name); effective ingredient concentration 80% by weight) | 6 parts |
| Colloidal silica (Nissan Chemical's Snowtex C (trade name)) | 4.8 parts |
| Surfactant, polyoxyethylene alkylphenyl ether (Kao's Emulgen 911 (trade name)) | 0.7 parts |
| Polystyrene (Nippon Zeon's Nipol UFN1008 (trade name); solid content 20% by weight) | 0.04 parts |
| Distilled water | 81 parts |

Coating Liquid for Photo-thermal Conversion Layer:

| | |
|---|---|
| Reaction product of 2,4-tolylene diisocyanate (4 mols), 1,3-butylene glycol (2 mols), 2,2'-dimethylolpropanoic acid (1 mol) and 1,2-tetrapropylene glycol (1 mol) | 4.0 parts |
| IR-absorbing dye (Nippon Photosensitive Dye Laboratory's NK-3508 (trade name)) | 1.0 parts |
| Fluorine-containing surfactant (Dai-Nippon Ink's Megafac F177 (trade name)) | 0.005 parts |
| Propylene glycol monomethyl ether | 100.0 parts |

These precursors were processed under the same condition as that for the precursors in Examples 3 to 5 and Comparative Examples 4 and 5, and the resulting printing plates were evaluated in the same manner as above. The result is given in Table 3 below.

TABLE 3

| Sample | Thickness of Photo-thermal Conversion Layer | Laser Power | Amount of Photo-thermal Conversion Layer having remained in finished printing plate | Ink Density in Image Area |
|---|---|---|---|---|
| Example 14 | 1.0 g/m$^2$ | 100 mW | 0.9 g/m$^2$ | A |
| Example 15 | 1.0 g/m$^2$ | 300 mW | 0.8 g/m$^2$ | A |
| Example 16 | 1.0 g/m$^2$ | 500 mW | 0.6 g/m$^2$ | A |
| Example 17 | 1.0 g/m$^2$ | 700 mW | 0.3 g/m$^2$ | A |
| Comp. Ex. 8 | 1.0 g/m$^2$ | 900 mW | 0 g/m$^2$ | D |

From Table 3, it is understood that the waterless lithographic printing plates obtained according to the plate-making method of Examples 14 to 17 all enjoyed good ink adhesion to the image area thereof.

Specifically, it is understood that, so far as the precursors are processed under conditions under which a part of the photo-thermal recording layer remains in the laser-exposed area of the finished printing plates, the ink adhesiveness to the image area of the printing plates can be improved irrespective of the type of the undercoat layer and that of the photo-thermal conversion layer in the precursors and of the type of the photo-thermal converting agent used therein.

Examples 18 to 20

Comparative Examples 9 and 10

Waterless lithographic printing plate precursors all having good interlayer adhesiveness were fabricated in the same manner as in Example 3. For these, however, the undercoat layer used in Example 14 was used, no interlayer was provided, and a back coat layer and a protective layer both described below were formed on their back surface.

Formation of Back Coat Layer

According to a wire bar coating method, a coating liquid described below was applied onto the back surface of each precursor, and dried at 180° C. for 30 seconds to form thereon a back coat layer having a dry thickness of 0.2 μm.

Coating Liquid for Back Coat Layer:

| | |
|---|---|
| Aqueous dispersion of acrylic resin (Nippon Junyaku's Julimer ET-410 (trade name); solid content 20% by weight) | 10 parts |
| Aqueous dispersion of tin oxide-antimony oxide (mean particle size 0.1 μm; 17% by weight) | 90 parts |
| Melamine compound (Sumitomo Chemical's Sumitex Resin M-3 (trade name); effective ingredient concentration 80% by weight) | 0.2 parts |

-continued

| | |
|---|---|
| Aqueous solution of sodium alkylsulfonate (Sanyo Kasei's Sanded BL (trade name): 44% by weight) | 0.6 parts |
| Distilled water | 45 parts |

Formation of Protective Layer:

According to a wire bar coating method, a coating liquid described below was applied onto the back coat layer, and dried at 170° C. for 30 seconds to form thereon a protective layer having a dry thickness of 0.05 µm.

Coating Liquid for Protective Layer:

| | |
|---|---|
| Polyolefin latex (Mitsui Chemical's Chemipearl S-120 (trade name); solid content 27% by weight) | 6.2 parts |
| Colloidal silica (Nissan Chemical's Snowtex C (trade name)) | 1.2 parts |
| Aqueous solution of sodium alkylsulfonate (Sanyo Kasei's Sanded BL (trade name); 44% by weight) | 0.6 parts |
| Epoxy compound (Nagase Kasei's Denacole EX-614B (trade name); effective ingredient concentration 100% by weight) | 0.6 parts |
| Distilled water | 90 parts |

These precursors were processed under the same condition as that for the precursors in Examples 3 to 5 and Comparative Examples 4 and 5, and the resulting printing plates were evaluated in the same manner as above. The result is given in Table 4 below.

TABLE 4

| Sample | Thickness of Photo-thermal Conversion Layer | Laser Power | Amount of Photo-thermal Conversion Layer having remained in finished printing plate | Ink Density in Image Area |
|---|---|---|---|---|
| Example 18 | 1.0 g/m² | 100 mW | 0.8 g/m² | A |
| Example 19 | 1.0 g/m² | 300 mW | 0.6 g/m² | A |
| Example 20 | 1.0 g/m² | 500 mW | 0.3 g/m² | A |
| Comp. Ex. 9 | 1.0 g/m² | 700 mW | 0 g/m² | D |
| Comp. Ex. 10 | 1.0 g/m² | 900 mW | 0 g/m² | D |

It is understood that, according to the plate-making method of the invention, waterless lithographic printing plates that enjoy good ink adhesion to the image area thereof are obtained even when a back coat layer is formed on the back surface of the precursors.

Examples 21 to 23

Comparative Examples 11 and 12

Waterless lithographic printing plate precursors all having good interlayer adhesiveness were fabricated in the same manner as in Example 3, for which, however, the support used was a white polyester film, MELINEX 329™ (from DuPont) containing a filler of BaSO₄ and having a thickness of 178 µm, and not the support used in Example 3.

These precursors were processed under the same condition as that for the precursors in Examples 3 to 5 and Comparative Examples 4 and 5, and the resulting printing plates were evaluated in the same manner as above. The result is as in Table 5 below.

TABLE 5

| Sample | Thickness of Photo-thermal Conversion Layer | Laser Power | Amount of Photo-thermal Conversion Layer having remained in finished printing plate | Ink Density in Image Area |
|---|---|---|---|---|
| Example 21 | 1.0 g/m² | 100 mW | 0.8 g/m² | A |
| Example 22 | 1.0 g/m² | 300 mW | 0.6 g/m² | A |
| Example 23 | 1.0 g/m² | 500 mW | 0.3 g/m² | A |
| Comp. Ex. 11 | 1.0 g/m² | 700 mW | 0 g/m² | D |
| Comp. Ex. 12 | 1.0 g/m² | 900 mW | 0 g/m² | D |

Even in Examples 21 to 23 in which the support was changed, waterless lithographic printing plates having improved ink adhesiveness to the image area thereof were obtained according to the plate-making method of the invention, as in Examples 3 to 5.

Example 24

The waterless lithographic printing plate precursor fabricated in Example 18 was processed in a Heidelberg's full-color printing system (Quickmaster DI46-4, trade name), in which the precursor exposed to light and in-line developed into a printing plate. The printing plate was evaluated in the same manner as above. The amount of the photo-thermal recording layer having remained in the image area of the printing plate was 0.6 g/m², and the ink density rank of the printing plate was A. The printing plate gave good full-color prints all having high image density.

The waterless lithographic printing plate precursors fabricated in the Examples all have good interlayer adhesiveness, and no coating layer peeled off in their production. In addition, in the plate-making process and in the printing process, the silicone rubber layer and the photo-thermal conversion layer in the non-image area of the printing plates did not peel off.

Comparative Example 13

A waterless lithographic printing plate precursor for Comparative Example 13 was fabricated in the same manner as in Example 3. In this, however, an undercoat layer (B) described below was formed in place of the undercoat layer (B) and the interlayer (E-1) in Example 3.

Coating Liquid for Undercoat Layer

| | |
|---|---|
| Vinyl chloride-vinyl acetate copolymer (Union Carbide's VAGH (trade name)) | 5 parts |
| Organic titanate (Nippon Soda's T-50 (trade name)) | 1.2 parts |
| Fluorine-containing surfactant (Dai-Nippon Ink's Megafac F177 (trade name)) | 0.01 parts |
| Propylene glycol monomethyl ether | 100.0 parts |
| Methyl ethyl ketone | 100.0 parts |

The precursor was processed under the same condition as that for the precursor in Example 3, and the resulting printing plate was evaluated in the same manner as therein. Since the undercoat layer in this printing plate did not contain polyurethane, the adhesiveness of the photo-thermal conversion layer therein was poor. When the printing plate was used in printing, the silicone rubber layer and the photo-thermal conversion layer in the non-image area therein peeled away.

The waterless lithographic printing plates produced according to the plate-making method of the invention all enjoyed good ink adhesion to the image area thereof, ensuring high-level interlayer adhesiveness of the constituent layers.

While the invention has been described in detail and with reference to specific embodiments thereof, it will be apparent to one skilled in the art that various changes and modifications can be made therein without departing from the spirit and scope thereof.

What is claimed is:

1. A plate-making method for processing a waterless lithographic printing plate precursor, which method comprises:

(I) an exposing step of imagewise exposure of the precursor with a laser such that portions of a laser-exposed area in a photo-thermal conversion layer in the precursor remain in the photo-thermal conversion layer of the finished printing plate; and (II) a developing step of removing a silicone rubber layer in the laser-exposed area to form an image on the printing plate, wherein the precursor to be processed comprises:

(A) a support;
(B) an undercoat layer formed by applying onto the support a coating liquid that contains a water-dispersible polymer and water as a solvent, and then drying the coating liquid;
(C) a photo-thermal conversion layer which comprises polyurethane and a photo-thermal converting agent; and
(D) a silicone rubber layer, laminated in that order.

2. The plate-making method according to claim 1, wherein the undercoat layer (B) in the precursor has a crosslinking structure.

3. The plate-making method according to claim 2, wherein the crosslinking structure is formed through reaction of a crosslinking agent with a binder that has a crosslinkable group capable of reacting with the crosslinking agent.

4. The plate-making method according to claim 3, wherein the crosslinkable group in the binder comprises at least one of methylol, hydroxyl, carboxyl and glycidyl groups.

5. The plate-making method according to claim 3, wherein the crosslinking agent comprises at least one of melamine compounds, aldehyde compounds and derivatives thereof, active vinyl compounds, active halogen compounds and epoxy compounds.

6. The plate-making method according to claim 5, wherein the crosslinking agent comprises a melamine compound having a functional equivalent of from 50 to 300, as obtained by dividing molecular weight of the compound by a number of methylol and/or alkoxymethyl groups in one molecule of the compound.

7. The plate-making method according to claim 1, wherein the undercoat layer (B) contains metal oxide particles.

8. The plate-making method according to claim 1, wherein the amount of the photo-thermal conversion layer (C) remaining in the finished printing plate is at least 0.01 g/m$^2$.

9. The plate-making method according to claim 1, wherein the amount of the photo-thermal conversion layer (C) remaining in the finished printing plate is at least 0.1 g/m$^2$.

10. The plate-making method according to claim 1, wherein the amount of the photo-thermal conversion layer (C) remaining in the finished printing plate is at least 0.2 g/m$^2$.

11. The plate-making method according to claim 1, wherein the amount of the photo-thermal conversion layer (C) remaining in the finished printing plate is at least 0.5 g/m$^2$.

12. The plate-making method according to claim 1, wherein the amount of the photo-thermal conversion layer (C) remaining in the finished printing plate is at least 0.6 g/m$^2$.

13. The plate-making method according to claim 1, wherein the photo-thermal converting agent is carbon black.

14. The plate-making method according to claim 1, wherein the amount of the photo-thermal converting agent is between 1 and 70% by weight of the composition for the photo-thermal conversion layer (C).

15. The plate-making method according to claim 1, wherein the amount of the photo-thermal converting agent is between 5 and 50% by weight of the composition for the photo-thermal conversion layer (C).

16. The plate-making method according to claim 1, wherein the thickness of the photo-thermal conversion layer (C) in the precursor is between 0.05 and 10 g/m$^2$.

17. The plate-making method according to claim 1, wherein the thickness of the photo-thermal conversion layer (C) in the precursor is between 0.1 and 5 g/m$^2$.

18. The plate-making method according to claim 1, wherein the silicone rubber layer (D) is formed by curing condensation-curable silicone with a crosslinking agent.

19. The plate-making method according to claim 1, wherein the silicone rubber layer (D) is formed by additional polymerizing of addition-polymerizable silicone in the presence of a catalyst.

20. The plate-making method according to claim 1, wherein a recording wavelength of the laser used for exposing the precursor is in a range from 800 nm to 1100 nm.

* * * * *